(12) United States Patent
Potkonjak et al.

(10) Patent No.: US 7,467,359 B2
(45) Date of Patent: Dec. 16, 2008

(54) DECODER USING A MEMORY FOR STORING STATE METRICS IMPLEMENTING A DECODER TRELLIS

(75) Inventors: Miodrag Potkonjak, Fremont, CA (US); Seapahn Megerian, West Hills, CA (US); Advait Mogre, Sunnyvale, CA (US); Dusan Petranovic, Cupertino, CA (US)

(73) Assignee: LSI Corporation, Milpitas, CA (US)

( * ) Notice: Subject to any disclaimer, the term of this patent is extended or adjusted under 35 U.S.C. 154(b) by 456 days.

(21) Appl. No.: 11/266,687

(22) Filed: Nov. 3, 2005

(65) Prior Publication Data

US 2006/0067436 A1    Mar. 30, 2006

Related U.S. Application Data

(62) Division of application No. 10/304,289, filed on Nov. 26, 2002, now Pat. No. 7,017,126.

(51) Int. Cl.
*G06F 17/50* (2006.01)
*H03M 13/03* (2006.01)

(52) U.S. Cl. .............. 716/1; 716/4; 714/792; 714/795; 714/799

(58) Field of Classification Search ............ 716/1, 716/4; 714/792, 795, 799
See application file for complete search history.

(56) References Cited

U.S. PATENT DOCUMENTS

| | | | |
|---|---|---|---|
| 5,796,757 A | 8/1998 | Czaja | 714/789 |
| 5,802,116 A | 9/1998 | Baker et al. | 375/341 |
| 6,598,205 B1* | 7/2003 | Luetkemeyer | 714/795 |
| 6,948,114 B2 | 9/2005 | Potkonjak et al. | 714/792 |

OTHER PUBLICATIONS

Metacores: Design and Optimization Techniques, Proceedings 2001 Design Automation Conference, pp. 585-590, Jun. 2001.

MetaCore: An Application-Specific Programmable DSP Development System, IEEE Transactions on VLSI Systems, pp. 173-183, Apr. 2000.

MetaCore: A Configurable & Instruction-Level Extensible DSP Core, Proceedings of the ASP-DAC 1998, pp. 325-326, Feb. 1998.

MetaCore: An Application-Specific DSP Development System, Proceedings of 1998 Design Automation Conference, pp. 800-803, Jun. 1998.

S. Swaminathan et al., A Dynamically Reconfigurable Adaptive Viterbi Decoder, Proceedings of the 2002 ACM/SUGDA Tenth International Symposium on Field-Programmable Gate Arrays, pp. 227-235, Feb. 2002.

* cited by examiner

*Primary Examiner*—Vuthe Siek
*Assistant Examiner*—Magid Y Dimyan
(74) *Attorney, Agent, or Firm*—Christopher P. Maiorana, PC

(57) ABSTRACT

A method for developing a circuit is disclosed. The method generally comprises the steps of (A) generating a solution space having a dimension for each of a plurality of parameters for the circuit, (B) evaluating a plurality of instances of the circuit in the solution space through a software simulation, (C) evaluating the instances through a hardware simulation, and (D) updating the instances in response to the software simulation and the hardware simulation to approach an optimum instance of the instances for the circuit.

5 Claims, 10 Drawing Sheets

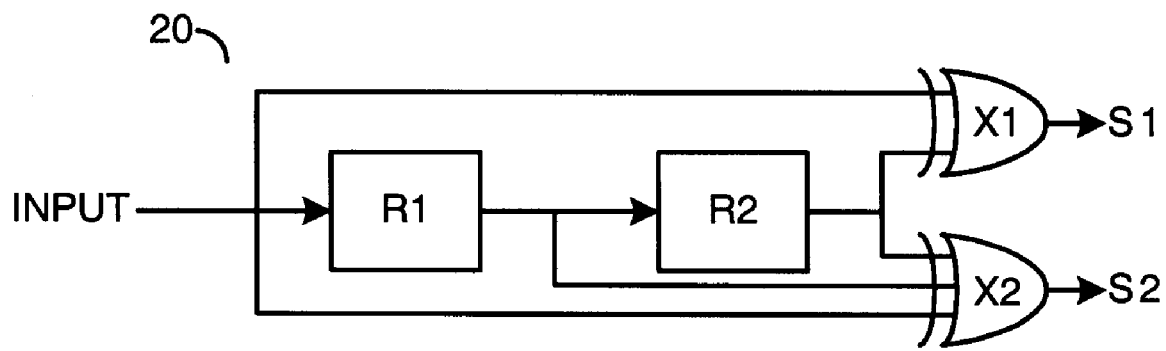
(CONVENTIONAL)
FIG. 1
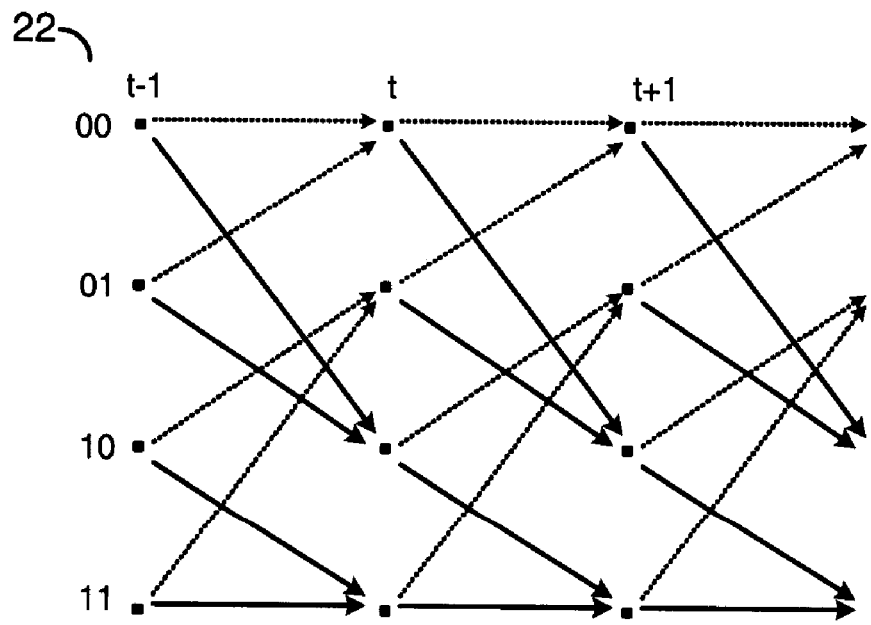
(CONVENTIONAL)
FIG. 2

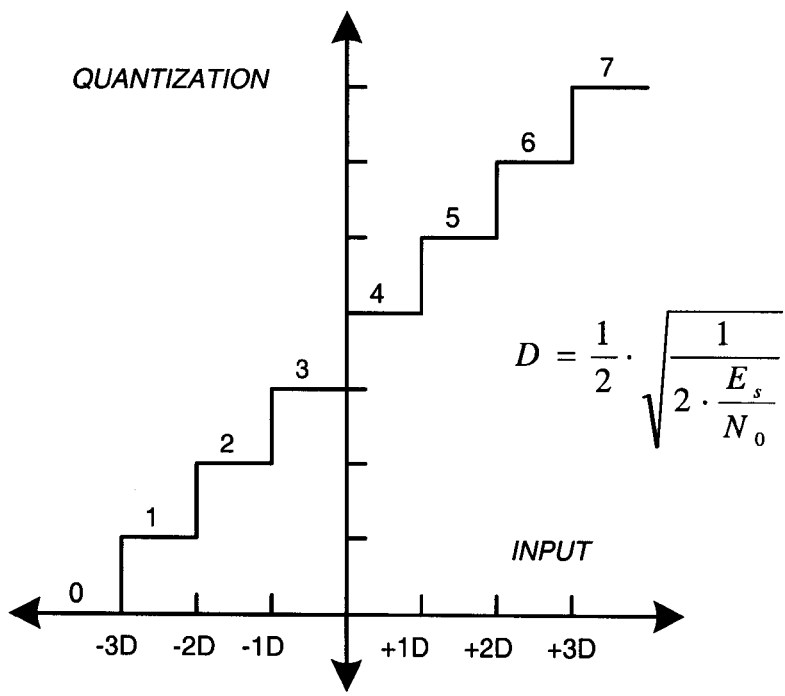
(CONVENTIONAL)
FIG. 3

DECODER USING A MEMORY FOR STORING STATE METRICS IMPLEMENTING A DECODER TRELLIS

This is a divisional of U.S. Ser. No. 10/304,289, filed Nov. 26, 2002 now U.S. Pat. No. 7,017,126.

FIELD OF THE INVENTION

The present invention relates to intellectual property (metacore) design and optimization generally and, more particularly, to Viterbi decoder designs and filter designs.

BACKGROUND OF THE INVENTION

Currently, hardware intellectual property (IP) is delivered at three levels of abstraction: hard, firm, and soft. The rapidly growing gap between silicon capacity and design productivity has resulted in a pressing need for design reuse. Hardware building blocks, usually under the name of cores, have become increasingly popular as an efficient way of reusing design intellectual property (IP). While several potential classification schemes exist for integrated circuits (IC) IP, the classification of cores according to levels of implementation details is popular. Hard cores are IPs completely implemented using a particular physical design library. Firm cores are also completely implemented, including physical design, but are targeted at a symbolic library. Finally, soft cores are described in high level languages such as Very High Speed Integrated Circuit Hardware Description Language (VHDL) or Verilog.

While hard cores provide complete information about all relevant design parameters and facilitate high levels of performance and implementation parameter optimization for the selected library, soft cores are superior in terms of flexibility and application range. Initially, hard cores dominated the IP reuse market and practice, but recently there is an increasing trend toward other types of cores and in particular, soft cores. Additionally, parameterized, configurable, and programmable cores have been rapidly gaining popularity.

Although IC component reuse has been widely practiced at many design centers since the beginnings of silicon designs, in the last few years a strong consensus has formed that IP reuse will be a dominant enabling force for the future generation of designs. A number of design companies have been making strong efforts to develop their IP portfolio, often mainly for internal use. There are also several companies who have completely based a business model on providing design IP. Thus, IP creation, assembly, and testing have received significant recent research attention.

The Viterbi decoding process has by far been the most widely studied and used convolutional error correction code in both wired and wireless communication. Viterbi decoding is considered a fundamental Digital Signal Processing (DSP) method and the performances of modern DSP chips are often quoted in terms of a Viterbi decoding speed.

Filtering (i.e., processing) on streams of data is another fundamental task widely used in digital signal processing, communication, and control applications. Infinite Impulse Response (IIR) filters are particularly attractive due to a relatively low implementation complexity. A variety of different topological structures have been proposed for the realization of IIR filters, including direct form, cascade, parallel, continued fraction, ladder, wave digital, state-space digital, orthogonal and multi-variable digital lattice. Today, in addition to many public domain IIR filter design programs, there are also well supported commercial design tools for synthesis of IIR filters.

Technique selection and design has been a popular research topic in a number of research fields, particularly in artificial intelligence where four main directions have emerged: first order logic-based methods, rewrite systems, transformational approaches and schematic-based programming. While the four techniques are strategically and procedurally very different, the techniques all share a common weakness in an inability to scale to problems of practical importance. Several very large scale integration DSP efforts have also addressed the method selection and design process.

Multi-resolution techniques have been popular for a long time, in particular in image, video, and in general, digital signal processing. The popularity of multi-resolution techniques in DSP has been further amplified with the introduction of wavelet transforms. Multi-resolution techniques have also been widely used in numerical techniques and in mesh-based finite element techniques.

In most modern communication systems, channel coding is used to increase throughput, add error detection and correction capabilities, and provide a systematic way to translate logical bits of information to analog channel symbols used in transmission. Convolutional coding and block coding are the two major forms of channel coding used today. In convolutional coding, the output is based on a current input and a current state with no defined end while in block coding chunks of input data are processed at a time. Generally, convolutional coding is better suited for processing continuous data streams with relatively small latencies. Also, since convolutional forward error correction (FEC) works well with data streams affected by the atmospheric and environmental noise (i.e., Additive White Gaussian Noise) encountered in satellite and cable communications, convolutional coders have found widespread use in many advanced communication systems.

Convolutional codes are usually defined using the two parameters, code rate (k/n) and constraint length (K). The code rate of the convolutional encoder is calculated as the ratio k/n where k is the number of input data bits and n is the number of channel symbols output by the encoder. The constraint length K is directly related to the number of registers in the encoder. The (shift) registers hold the previous data values that are systematically convolved with the incoming data bits. The redundancy of information in the final transmission stream is a key factor enabling the error correction capabilities used when dealing with transmission errors.

Referring to FIG. 1, an example of a conventional rate convolutional encoder 20 with K=3 (i.e., four states) is shown. The conventional encoder 20 generates two channel symbols (i.e., S1 and S2) as each incoming data bit is shifted into register flip-flops R1 and then R2. Connections from the registers R1 and R2 to the output XOR gates X1 and X2 are defined by a polynomial G. There are many studies that show the optimal K and G in different situations. Although the rate encoding effectively reduces the raw data throughput by a factor of two, the power savings gained due to the increased reliability of the channel offset the negative effects of the reduced throughput and overall, the technique improves the efficiency of the channel.

Viterbi decoding and sequential decoding are currently the two main types of processes used with convolutional codes. Although sequential decoding performs very well with long-constraint-based convolutional codes, sequential decoding has a variable decoding time and is less suited for hardware implementations. On the other hand, the Viterbi decoding process has fixed decoding times and is well suited for hardware implementations. An exponentially increasing computation criteria as a function of the constraint length K limits current implementations of the Viterbi decoder to about a constraint length K equal to nine.

Viterbi decoding, also known as maximum-likelihood decoding, comprises the two main tasks of updating a trellis and trace-back. The trellis used in Viterbi decoding is essentially the convolutional encoder state transition diagram with an extra time dimension. The trace-back is used to determine the most likely bit sequence received by the encoder 20.

Referring to FIG. 2, an example of a conventional trellis diagram 22 for a four-state (i.e., K=3) Viterbi decoder is shown. The four possible convolutional encoder states are depicted as four rows (i.e., 00, 01, 10 and 11) in the trellis diagram 22. Solid arrows represent branch transitions based on logical "1" inputs to the encoder 20 and the dashed arrows represent branch transitions based on logical "0" inputs to the encoder 20. The encoder 20 produces two channel symbols S1 and S2 associated with each branch in the trellis 22.

After each time instance or step t, elements in the column t contain the accumulated error metric for each encoder state, up to and including time t. Every time a pair of channel symbols S1 and S2 is received, the process updates the trellis by computing a branch metric associated with each possible transition. In hard decision decoding, the branch metric is most often defined to be the Hamming distance between the channel symbols S1 and S2 and the symbols 00, 01, 10 and 11 associated with each branch. For the hard decision rate decoding at two channel symbols per branch, the possible branch metric values are 0, 1, and 2, depending on the number of mismatched bits. The total error associated with taking each branch is a sum of the branch metric and the accumulated error value of a state metric from which the branch initiates. Since there are two possible branch transitions into each state, the smaller of the two accumulated error metrics is used to replace the current state metric value of each state.

The state with the lowest accumulated error metric is determined as the candidate for trace-back. A path created by taking each branch leading to the candidate state is traced back for a predefined number of steps. An initial branch in the trace-back path indicates the most likely transition in the convolutional encoder 20 and is therefore used to obtain the actual encoded bit value in the original data stream.

To make the decoder work, received channel symbols S1 and S2 are quantized. In hard decision decoding, channel symbols S1 and S2 are each either a logical "0" or a logical "1". Hard decision Viterbi decoders are extremely fast due to the small number of bits involved in the calculations. However, tremendous bit error rates (BER) improvements have been achieved by increasing the number of bits (resolution) used in quantizing the channel symbols S1 and S2.

Referring to FIG. 3, an example of a conventional uniform quantizer function 24 using 3-bits (eight levels) to represent a symbol received on the channel is shown. An energy per symbol to noise density ratio (i.e., Es/No) is used to calculate a decision level (i.e., D). The decision level D is then used to determine the branch metrics to a higher precision than just 0, 1 or 2. The higher precision branch metrics in turn create higher precision state metrics. The benefits of soft decision over hard decision decoding are offset by the cost of significantly bigger and slower hardware.

SUMMARY OF THE INVENTION

The present invention concerns a method for developing a circuit. The method generally comprises the steps of (A) generating a solution space having a dimension for each of a plurality of parameters for the circuit, (B) evaluating a plurality of instances of the circuit in the solution space through a software simulation, (C) evaluating the instances through a hardware simulation, and (D) updating the instances in response to the software simulation and the hardware simulation to approach an optimum instance of the instances for the circuit.

The objects, features and advantages of the present invention include providing a metacore design and optimization technique that may provide (i) an effective leverage of a potential of process design through performance simulation and area and speed estimations, (ii) an effective quantitative process design technique, (iii) new Viterbi decoding processes, (iv) a high performance, low cost, Viterbi decoder implementation for a variety of bit-error-rates and throughput criteria, and/or (v) flexibility in design and optimization methodology.

BRIEF DESCRIPTION OF THE DRAWINGS

These and other objects, features and advantages of the present invention will be apparent from the following detailed description and the appended claims and drawings in which:

FIG. 1 is a block diagram of a conventional convolution encoder;

FIG. 2 is a diagram of a conventional Viterbi trellis;

FIG. 3 is a diagram of a conventional uniform quantizer function;

DETAILED DESCRIPTION OF THE PREFERRED EMBODIMENTS

Figure 4:
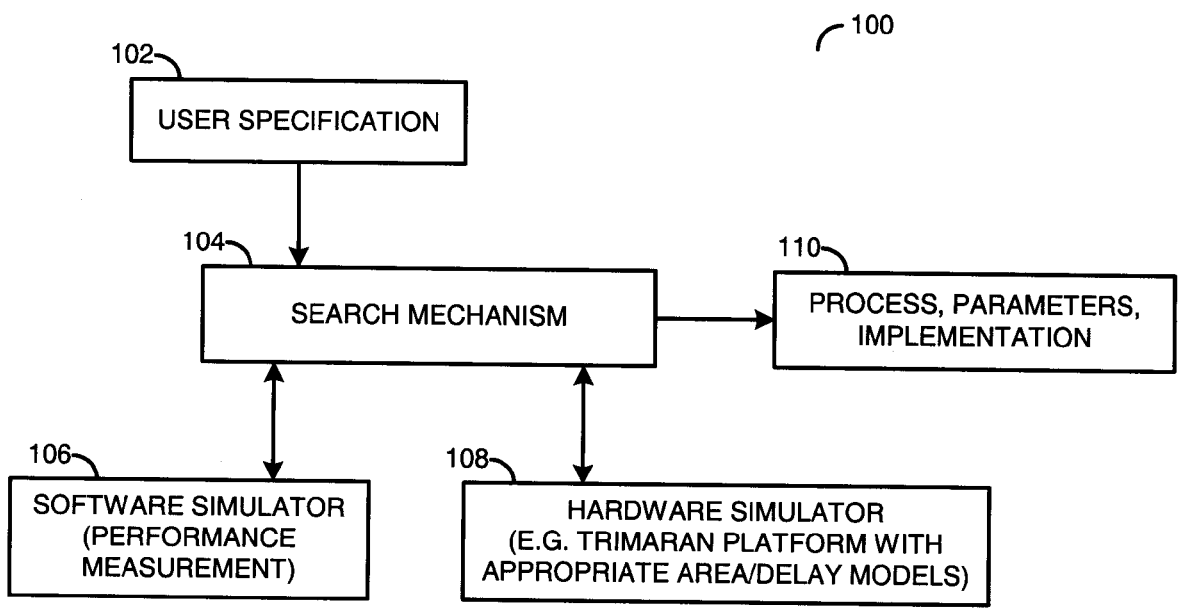
FIG. 4 is a flow diagram of a method for a metacore design flow in accordance with a preferred embodiment of the present invention.

Referring to FIG. 4, a flow diagram of a method for a metacore design flow 100 is shown in accordance with a preferred embodiment of the present invention. The metacore design flow 100 generally comprises a user specification block 102, a search mechanism block 104, a software simulator block 106, a hardware simulator block 108, and an implementation block 110. Flow between the search mechanism block 104 and both the software simulator block 106 and the hardware simulator block 108 may be iterative to optimize a solution space. The metacore design flow 100 generally starts at a process level and leverages on intrinsic optimization degrees of freedom. The resulting approach generally comprises four components: (i) problem formulation and identification of optimization degrees of freedom, (ii) objective functions and constraints, (iii) cost evaluation engine, and (iv) multi-resolution design space search.

The approach may consider a design optimization that may be suitable for efficient implementation at a level higher than a high-level language application that is generally a target for creating an IP core with respect to performance, estimate implementation area, and speed. Specifically, the degrees of freedom may be identified for process alternations under specific targeted implementation objective functions and constraints. By searching a process solution space, a process structure that may be best suited for a specified set of design goals and constraints may be identified.

Figure 5:
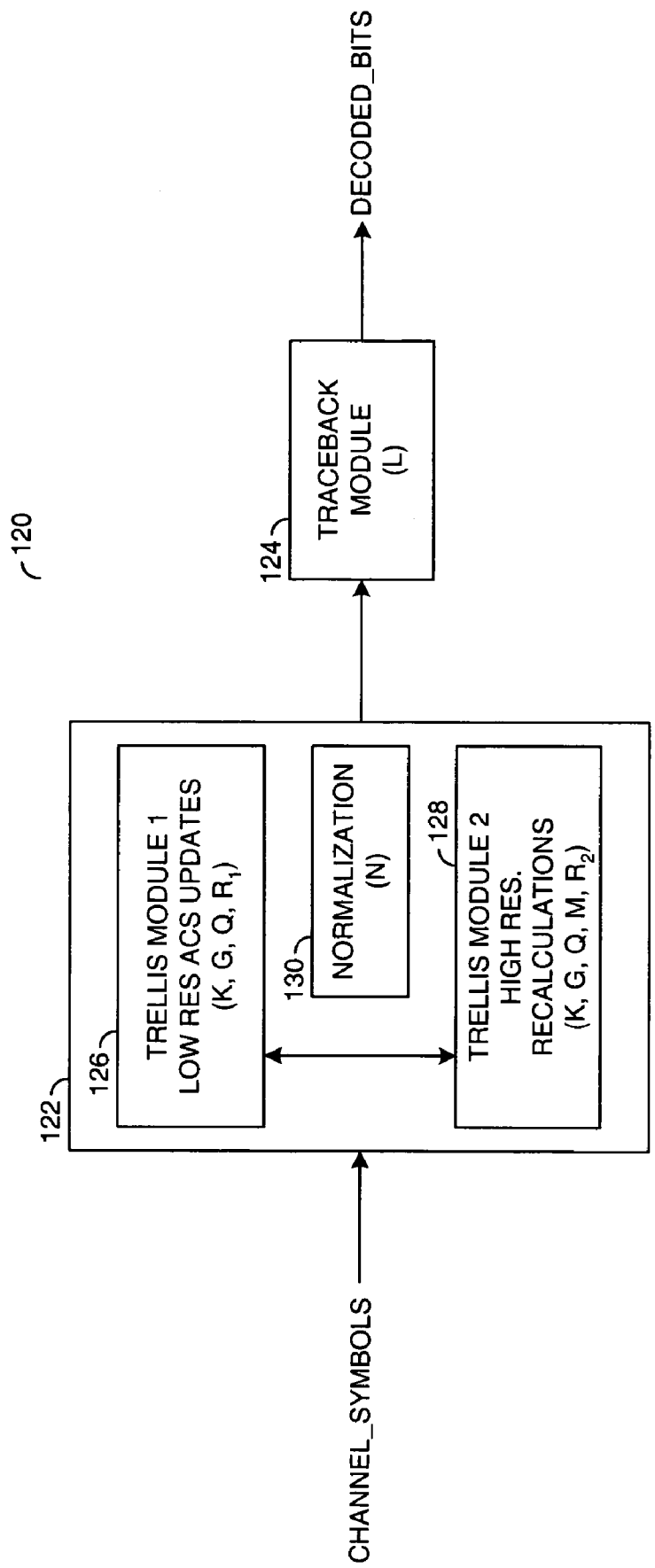
FIG. 5 is a block diagram of an example partial Viterbi decoder design.

Referring to FIG. 5, a block diagram of an example partial Viterbi decoder design 120 is shown. The Viterbi decoder design 120 generally comprises a circuit or module 122 and a circuit or module 124. The module 122 may be configured as a metrics module to generate a multi-resolution decoder trellis. The metrics module 122 may also generate state metrics for each time step of the decoder trellis based upon an input signal (e.g., CHANNEL_SYMBOLS). The module 124 may be configured as a trace-back module. The trace-back module 124 may be configured to perform a trace-back function through the decoder trellis a length (e.g., L) of time steps to generate a decoded signal (e.g., DECODED_BITS).

The metrics module 122 generally comprises a first trellis circuit or module 126, a second trellis circuit or module 128 and a normalization circuit or module 130. The first trellis module 126 may be configured to calculate the state metrics at a low resolution based upon the parameters K, G, Q, and a first resolution R1. The second trellis module 128 may be configured to recalculate one or more of the state metrics at a high resolution based upon the parameters K, G, Q, M and a second resolution R2. The normalization module 130 may be configured to normalize the recalculated high-resolution state metrics with the low-resolution metrics.

By way of example, altering several or the parameters in the Viterbi decoding process used in convolutional forward-error-correction, may have tremendous impacts on the attributes of the final design. Although an experienced designer may successfully guess the general outcome of changing each parameter, initially, a configuration that may be best suited for a specific application may not always be clear. Three different instances of an example Viterbi decoder may be provided in Table I as follows. Each instance is generally obtained by altering only a subset of the parameters that may effect the Viterbi decoding process. Three example criteria that may be used to evaluate a performance of the Viterbi decoder may include, but are not limited to, bit-error-rate (BER), throughput, and chip area. The criteria used and the estimated chip area for each instance when the targeted throughput may be fixed at 1 million bits per second (Mbps) in the example.

TABLE I

| K | Trellis Depth | Quantization Bits Low/High | Multi-Resolution Paths | Area mm$^2$ |
|---|---|---|---|---|
| 3 | 2 | 3/NA | NA | 0.26 |
| 5 | 5 | 1/3 | 8 | 0.56 |
| 7 | 5 | 1/3 | 4 | 1.73 |

Figure 6:
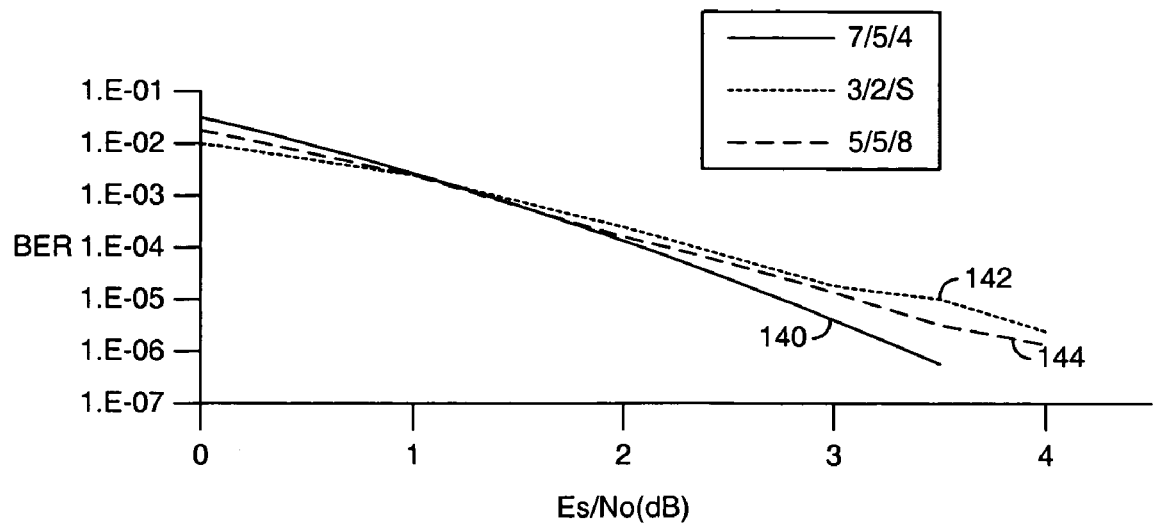
FIG. 6 is a graph of bit-error-rate (BER) curves obtained by software simulation for multiple decoder cases under varying signal-to-noise ratios.

Referring to FIG. 6, a graph of BER curves obtained by software simulation for multiple decoder case under varying signal-to-noise ratios is shown. Although all three cases exhibit comparable BER curves 140, 142 and 144, each generally has drastically different area estimates when the target throughput is fixed. The example of Table I and FIG. 6 show a few parameters, while in general, a practical solution space may be very large and complex. Note that performance generally indicates quantified qualities from an application point of view. For example, in error correction, a process performance may be measured by the BER while in lossy compression, the level of compression and loss rate may be used to measure performance.

Figure 7:
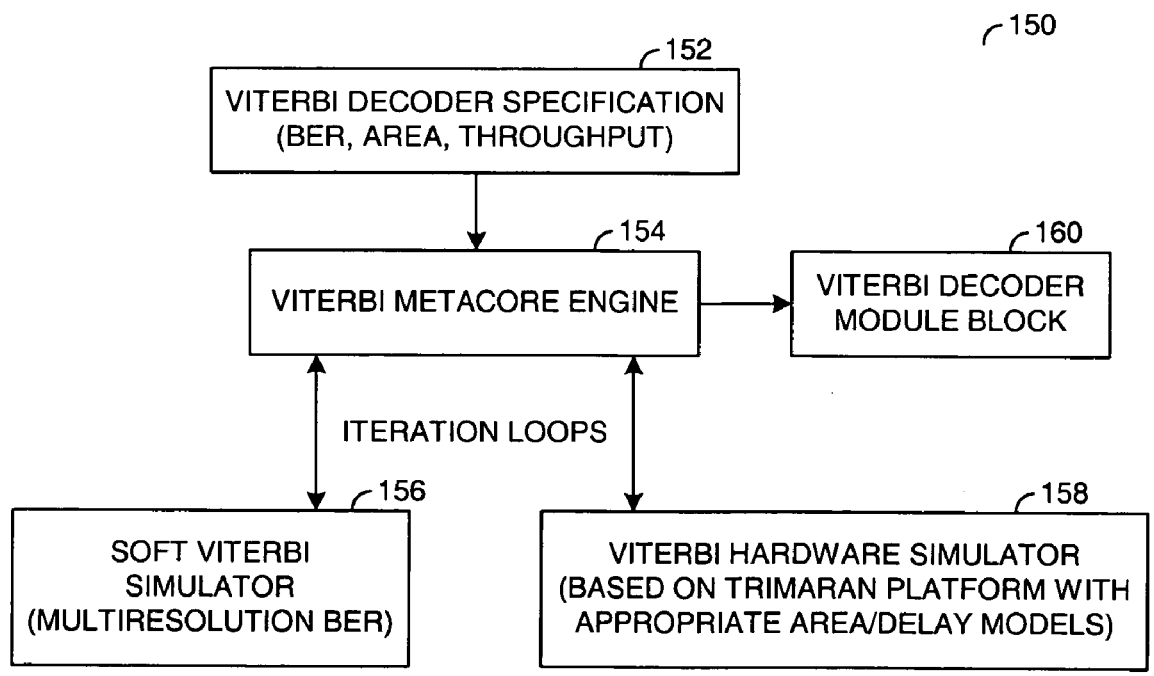
FIG. 7 is a flow diagram of a method for a Viterbi decoder metacore design flow.

Referring to FIG. 7, a flow diagram of a method for a Viterbi decoder metacore design flow 150 is shown. The metacore design flow 150 generally comprises a decoder specification block 152, a metacore search engine block 154, a software simulator block 156, a hardware simulator block 158, and a decoder module block 160. Flow between the metacore search engine block 154 and both the software simulator block 156 and the hardware simulator block 158 may be iterative to optimize a solution space. The optimized solution space may be presented to the decoder module block 160 for implementation.

Figure 8:
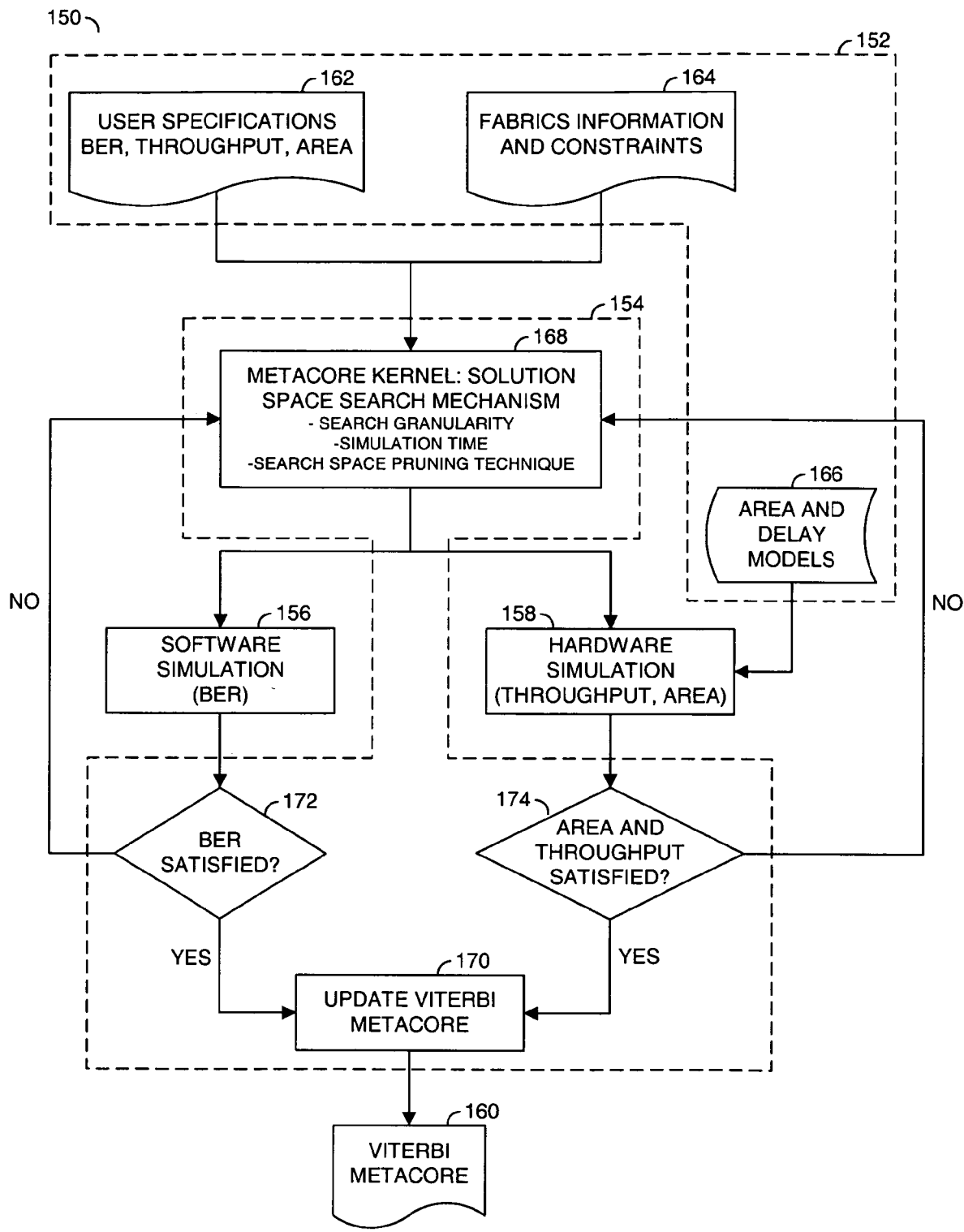
FIG. 8 is a detailed flow diagram of the Viterbi decoder metacore design flow.

Referring to FIG. 8 a detailed flow diagram of the Viterbi decoder metacore design flow 150 is shown. The decoder specification block 152 generally comprises a block 162, a block 164 and a block 166. The block 162 may define user type specifications. The user specifications may include, but are not limited to, a BER, a throughput, and an intended area. The block 164 may define fabrication information and constraints. The block 166 may define models. For example, the block 166 may define and area model and/or one or more delay models.

The metacore engine block 154 generally comprises a block 168, a block 170, a decision block 172 and a decision block 174. The block 168 may be implemented as a metacore kernel block. The metacore kernel block 168 generally comprises a storage for a solution space and a mechanism for searching the solution space. The solution space is generally defined as a multi-dimensional space constructed by the user specifications, the fabrication information and the fabrication constraints. The solution space may have a dimension for each defined parameter received from the decoder specification block 152.

The block 170 may be implemented as an update metacore block. The update metacore block 170 may isolate an acceptable and/or optimized decoder solution from the solution space once all of the criteria have been achieved. The decision block 172 may be used to evaluate the software simulation results against the appropriate parameters from the decoder specification block 152. For example, the decision block 172 may determine if the software simulation results satisfy the specified BER. The decision block 174 may be used to evaluate the hardware simulation results against the appropriate parameters from the decoder specification block 152. For example, the decision block 174 may determine if the hardware simulation results satisfy the intended area and throughput specifications. The metacore kernel block 168 may refine a search through the solution space by varying one or more of a search granularity, a simulation time and/or a search space pruning technique. Other techniques for altering the search mechanism may be implemented to meet a criteria of a particular application.

If the software simulation results are not acceptable (e.g., the NO branch of decision block 172), the process 150 may iterate back to the metacore kernel block 168 with a refined search criteria to determine another solution space. If the hardware simulation results are not acceptable (e.g., the NO branch of decision block 174), the process 150 may also iterate back to the metacore kernel block 168 with a refined search criteria to determine another solution space. Once the software simulation results have passed (e.g., the YES branch of decision block 172) and the hardware simulation results have passed (e.g., the YES branch of decision block 174), the update metacore block 170 may isolate the acceptable solution space. The decoder module block 160 may then generate and present an implementation for the Viterbi decoder design.

The process 150 may be applied to a variety of Viterbi decoder design approaches, such as the multi-resolution Viterbi decoder design 120. The benefits of soft decision over hard decision decoding in the Viterbi process may be offset by a cost of significantly bigger and slower hardware. The multi-resolution Viterbi decoding design 120 is generally based on an observation that at any given time, only a relatively small number of the trellis states may be possible candidates for trace-back while others trellis states with larger accumulated errors may be less likely to be useful. The observation may result in (i) updating the trellis using fewer bits and (ii) recalculate the branch metrics for several of the "better" paths (e.g., paths with smaller accumulated errors) using higher precision after each time step.

Since a candidate state with the minimum accumulated error is generally used as the starting point for the trace-back, the decoding process may be designed such that no state may be given an unfair advantage over the other states. The higher precision recalculation of branch metrics for the most likely candidate states generally improves the probability of selecting the real best state for trace-back. However, since the quantization and branch error calculation methods may be different for each case, a correction term may be added to the recalculated branch metrics to keep the accumulated error values normalized.

There are several methods of normalizing the lower and higher resolution branch metric values obtained during decoding. In general, an efficient approach of finding the correction value may be by calculating a difference between the best high resolution and the best low resolution branch metric at each iteration. The approach may be further improved by averaging the differences of two or more branch metrics. Experimental results generally show that improvements in performance may be achieved over hard decision decoding by recalculating a small fraction of the trellis paths.

There are many parameters that may effect the performance of the Viterbi decoder 120. For example, the domain of a solution space may be modeled as an 8-dimensional matrix. A list of parameters that constitute eight degrees of freedom are generally provided in Table II as follows:

TABLE II

| K | Constraint Length {3, 4, 5, 6, 7, ... } |
| L | Trace-back Depth {1*K, 2*K, 3*K, 4*K, 5*K, ... } |
| G | Encoder Polynomial (s) |
| R1 | Quantization used for high-resolution decoding |
| R2 | Quantization used for low-resolution decoding |
| Q | Quantization method (hard, fixed, adaptive) |
| N | Normalization method |
| M | Number of multi-resolution paths $(1, 2, \ldots, 2^{K-1})$ |

The parameter K may be the constraint length of the convolutional encoder and L may be the trace-back depth of the decoder. Although K and L do not have any theoretic bounds, current practical values are generally K<10 and L<30*K. Experimentation has shown that in most cases, trellis depths larger than 7*K may not have any significant impact on the BER. Several standard specifications of G generally exist for different values of K. A designer may have the option of selecting multiple variations of G, although in most cases G may be fixed.

The quantization resolution parameters R1 and R2 generally indicate a number of bits used in the calculation of the branch metrics. As discussed earlier, higher number of bits (e.g., soft decision) may translate to better BER performance. Also, the choice of the values of R1 and R2 may affect the multi-resolution normalization methods. Currently, the parameter N may be used to specify the number of branch metric values used in the calculation of the multi-resolution correction factor. For pure hard or soft decoding, the parameter N may be set to zero (e.g., no normalization). The parameter M generally specifies the number of trellis states (paths) that are recalculated using higher resolution in multi-resolution decoding.

The performance of each instance of the Viterbi decoder may be quantified in terms of the following metrics: (i) BER, (ii) area, and (iii) throughput. The software simulation 156 is generally used to measure the BER of each instance of the process under varying signal to noise ratios. Generally, the user defines a threshold curve that serves as a guide for the targeted BER performance. Area and throughput metrics may be obtained by simulating the process. The hardware simulation 158 may use a Trimaran environment that provides a compiler and hardware platform for parallel programmable Very Long Instruction Word (VLIW) and superscalar architectures. Trimaran may estimate the area criteria of each candidate solution for a fixed throughput. To evaluate each instance, the source code that Trimaran may compile and optimize may be specified. The Trimaran hardware architecture parameters such as register file sizes, memory hierarchy, number of Arithmetic Logic Units (ALU) and others may also be specified. During the simulation, Trimaran generally collects several statistics for each solution instance including a total number of operations executed (e.g., load, store, ALU, branch, etc.), a total number of cycles used to complete the decoding task for a fixed number of bits, dynamic register allocation overhead, and several other statistics. Trimaran area models may be used to obtain the area criteria of each instance based on the specified throughput at a particular clock rate.

A quadratic scaling factor (e.g., $\lambda$) may be used to scale the specified area to an architecture based on a feature size of $\alpha$ in microns (μm). The scaling factor may be defined by Equation 1 as follows:

$$\lambda = \left(\frac{\alpha}{0.35}\right)^2 \times \text{DATA\_PATH\_FACTOR} \qquad \text{Eq. (1)}$$

The value of DATA_PATH_FACTOR may be used to adjust the area based upon a width of a data path (e.g., number of bits) for a processor being simulated. Clock rates may be assumed to scale linearly with feature size with smaller sizes resulting in faster clock rates. Also, to account for different data path sizes, scaling factors may be used to adjust the clock rate.

Figure 9:
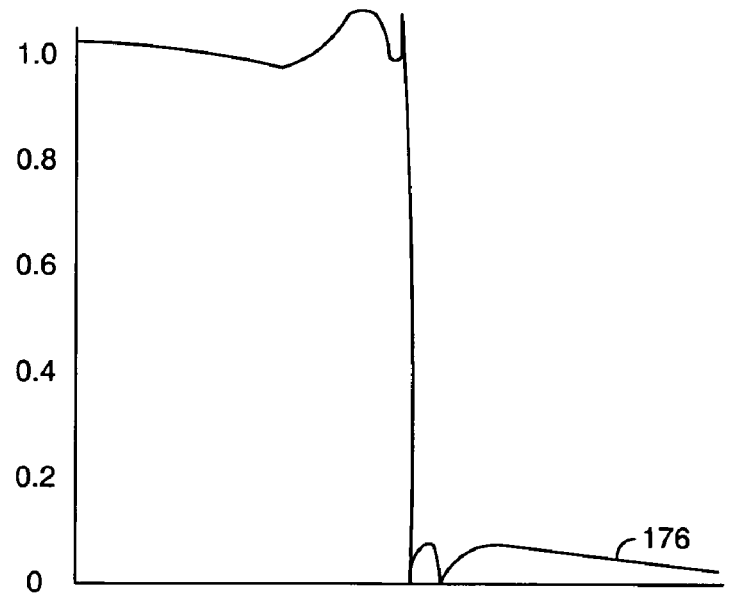
FIG. 9 is a transfer function of an example low-pass infinite impulse response filter.

Referring to FIG. 9, a transfer function 176 of an example low-pass Infinite Impulse Response (IIR) filter is shown. The functionality of IIR filters may be compactly and completely captured by a transfer function of the filter. Several parameters may characterize an IIR filter such as passband and stop-band frequencies, passband ripple, stop-band attenuation, 3-dB bandwidth, and gain. In general, an arbitrary transfer function may be developed with the process 150, however individual transfer functions may differ in terms of hardware solutions, such as number of multiplications, number of additions, word length, interconnect, and registers. Some solution structures may provide better options for implementation than other solutions based on one or more specifications, such as the throughput criteria.

There may be roughly $10^8$ distinct points in the solution space for the example Viterbi decoder and even more options for the IIR filter. Due to the large size of the solution space, exhaustive search methods may be ineffective. A multi-resolution search technique may be used to search the solution space in an efficient manner by concentrating search efforts on promising regions. The search may be initiated on a fixed grid in the solution space. For example, in the case of the Viterbi decoder with eight dimensions defined, up to 256 instances may be evaluated. However, in most practical cases the number of instances evaluated is generally much lower since some of the parameters may be fixed (e.g., the parameters G and N). Using the performance evaluated at each point on the grid as a guide, regions that are most promising in terms of area, throughput, and BER may be searched using a finer grid and more accurate simulation results (e.g., longer run times).

The following pseudo code generally describes the Viterbi metacore search process:
R=Initial search resolution
G=Initial sparse search points

```
Procedure Viterbi_Metacore_Search (G,R) {
    For each pi ∈ G
        pi.BER = Simulate and measure BER
        Find pi.Area using Trimaran using given pi.Throughput
    End For
    NewGridSet = Refine_Grid (G)
    NewR = R+Resolution_Increment
    If (NewR<Max_Search_Resolution)
        For each Gi NewGridSet
            Viterbi_Metacore_Search(Gi,NewR)
}
```

When calculating the new grid (Refine_Grid) regions, regions enclosed by the points that are more likely to contain promising solutions may be extracted. Since the area and throughput functions are generally smooth and continuous, an interpolation between the points on the grid may be performed to calculate initial estimates. However, BER may be probabilistic by nature and interpolation may lead to inaccurate conclusions especially if simulation times are kept short. Bayesian probabilistic techniques may be used to assign a BER probability to each point pi∈ G, based on neighboring BER values. Conditional probabilities about observed dependencies in the solution space points may be used to predict most likely value at points that may still to be considered during the search. The search may then be recursively executed on the newly formed regions with higher resolution to find and refine the best candidate solutions.

The design space parameters may be generally classified as: (i) discrete or continuous and (ii) correlated or non-correlated. The correlated parameters may be further distinguished using structures such as monotonic, linear, quadratic, probabilistic, and the like. Non-correlated parameters may be more difficult to handle since optimal solutions may not be found as rapidly using heuristic techniques. Also, the search method presented above for the Viterbi metacore design may be justified by the speed of the searching mechanism and ease of implementation. However, the optimization of the search and the results may be increased using longer simulation times and relaxing the search space pruning technique at a cost of longer run-times.

There are several parameters that may impact the performance and the computational complexity of IIR filters. The following degrees of freedom may be considered: (i) topological structure, (ii) number of stages, (iii) word length, and (iv) passband ripple characteristics. The performance of an instance of an IIR filter is generally measured using the following criteria: (i) 3-dB bandwidth, (ii) area, (iii) throughput, and (iv) latency. The software simulations 156 may be used to measure gain, 3-dB bandwidth, pass band ripple, and stop band attenuation characteristics. Area, throughput, and latency may be obtained using behavioral synthesis tools. Specifically, Hyper tools may be used for an early estimation of both active logic area (e.g., execution units, registers, and interconnect) as well as statistical tools for prediction of total area. The final implementation is generally obtained using Hyper and Lager tools. Both Hyper and Lager tools are public domain software that may be obtained from the Electrical Engineering and Computer Science Department, University of California, Berkeley, Calif.

To evaluate each candidate for implementation, user specified transfer functions may be entered in a Signal Processing Worksystem (SPW) and consequently generate Silage code which may be used as input to the Hyper behavioral synthesis tool. The Hyper tool may also generate timing information such as a length of a clock cycle and a number of cycles used. The information so generated may be used to compute throughput and latency.

A platform may be created for generating experimental results. For the platform, a main user interface, multi-resolution search process, and the multi-resolution Viterbi decoder simulator may be implemented as a Microsoft Windows™ application using Visual C++ 6.0 IDE. The Trimaran environment may be set up on an Intel Pentium III based personal computer running Linux 6.1. The resulting configuration facilitates a parallel execution of the Viterbi software and hardware simulations.

Figure 10:
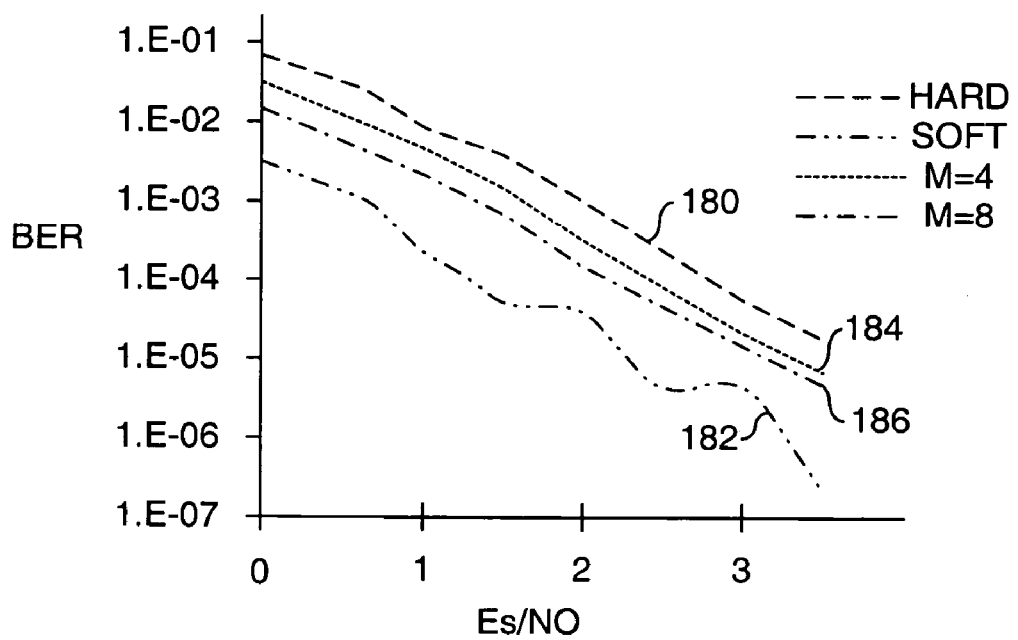
FIG. 10 is a graph of software simulations of BER vs. Es/No is shown for several decoding methods.

Referring to FIG. 10, a graph of software simulations of BER vs. Es/No is shown for several decoding methods. Two of the software simulations were generally used to measure the performance (in terms of the BER) of each instance of the Viterbi decoder 120 under varying signal to noise ratios. Several configuration files and scripts were generally used to specify the range of parameters used and automate user tasks. Curves 180, 182, 184 and 186 generally show the relative BER for hard, soft, and multi-resolution Viterbi decoding with K=5, using 1-bit low-resolution and 3-bit adaptively quantized high-resolution decoding. A pure hard-decision Viterbi decoding method is generally shown by the curve 180. A pure soft-decision Viterbi decoding method is generally shown by the curve 182. Two multi-resolution Viterbi decoding methods with K=5 using 1-bit hard-decision low resolution and 3-bit adaptive soft decoding high-resolution as the multi-resolution parameters are generally shown by the curves 184 and 186. The curve 184 may have the number of selected high resolution paths parameter M=4. The curve 186 may have the number of selected high resolution paths parameter M=8. On average, using four high-resolution paths (e.g., curve 184) generally resulted in a 64% improvement in the BER as compared with the pure hard-decision decoding method illustrated by the curve 180. Using eight high-resolution paths (e.g., curve 186) generally resulted in 82% improvement in the BER over the pure hard-decision decoding method illustrated by the curve 180.

The results of several metacore search outcomes using different parameter specifications is generally shown in Table III as follows:

TABLE III

| Target BER (at Es/No = 1.0) Target Throughput | $1 \times 10^{-2}$ 5 Mbps | $1 \times 10^{-4}$ 2 Mbps | $1 \times 10^{-5}$ 1 Mbps | $1 \times 10^{-5}$ 3 Mbps | $1 \times 10^{-9}$ 1 Mbps |
|---|---|---|---|---|---|
| K | 3 | 5 | 7 | 7 | x |
| L (*K) | 4 | 6 | 7 | 7 | x |
| G | 7,5 | 35,23 | 171,133 | 171,133 | x |
| R1 (bits) | 2 | 1 | 3 | 2 | x |
| R2 (bits) | NA | 3 | NA | 4 | x |
| Q | A | F | A | A | x |
| N | 1 | 1 | 1 | 1 | x |
| M | NA | 5 | NA | NA | x |
| Area (mm$^2$) | 0.35 | 1.2 | 2.2 | 3.3 | Not Feasible |

In each case, (i) the BER and the throughput were specified and (ii) the normalization (N) and the polynomial (G) were fixed to generally speed up the search process. The estimated area criteria and the associated Viterbi metacore parameters have been included for comparison.

The effectiveness of the metacore design technique on the IIR designs may be examined based upon experimental results. An example bandpass IIR filter with the following characteristics may be considered: $\omega p1=0.411111\pi$, $\omega p2=0.466667\pi$, $\xi p=0.015782$, $\omega s1=0.3487015\pi$, $\omega s2=0.0.494444\pi$, $\xi s=0.0157816$, where $\omega p1$ and $\omega p2$ may be bandpass frequencies, $\xi s1$ and $\xi s2$ may be stop-band frequencies, $\xi p$ may be a passband ripple, and $\xi s$ may be a stop-band ripple (assuming a standard normalized filter characteristics).

The experimental results, after applying the multi-resolution search process on the IIR filter, may be shown in Table IV as follows:

TABLE IV

| Throughput (µs) | Multi-Res. Area (mm$^2$) | Average Area (mm$^2$) | Reduction % | Structure |
|---|---|---|---|---|
| 5 | 5.73 | 15.75 | 63.62 | Ladder |
| 4 | 5.92 | 18.27 | 67.60 | Parallel |
| 3 | 5.92 | 19.94 | 70.31 | Parallel |
| 2 | 5.92 | 21.08 | 71.92 | Parallel |
| 1 | 6.11 | 35.81 | 82.94 | Cascade |
| 0.5 | 11.63 | 69.98 | 83.39 | Cascade |
| 0.25 | 22.14 | 158.90 | 86.07 | Cascade |

The first column of Table IV generally shows a throughput of the filter(s). The second column generally indicates a best solution in terms of the area. The third column generally shows an average case solution (in terms of the area). Column four generally indicates a percentage improvement in the area after applying the metacore optimization in comparison with the average case. The last column of Table IV generally shows a structure of the filter that was used to produce the best implementation. The average and median reduction in area over all designs generated during the search process were 75.12% and 71.92% respectively.

Figure 11:
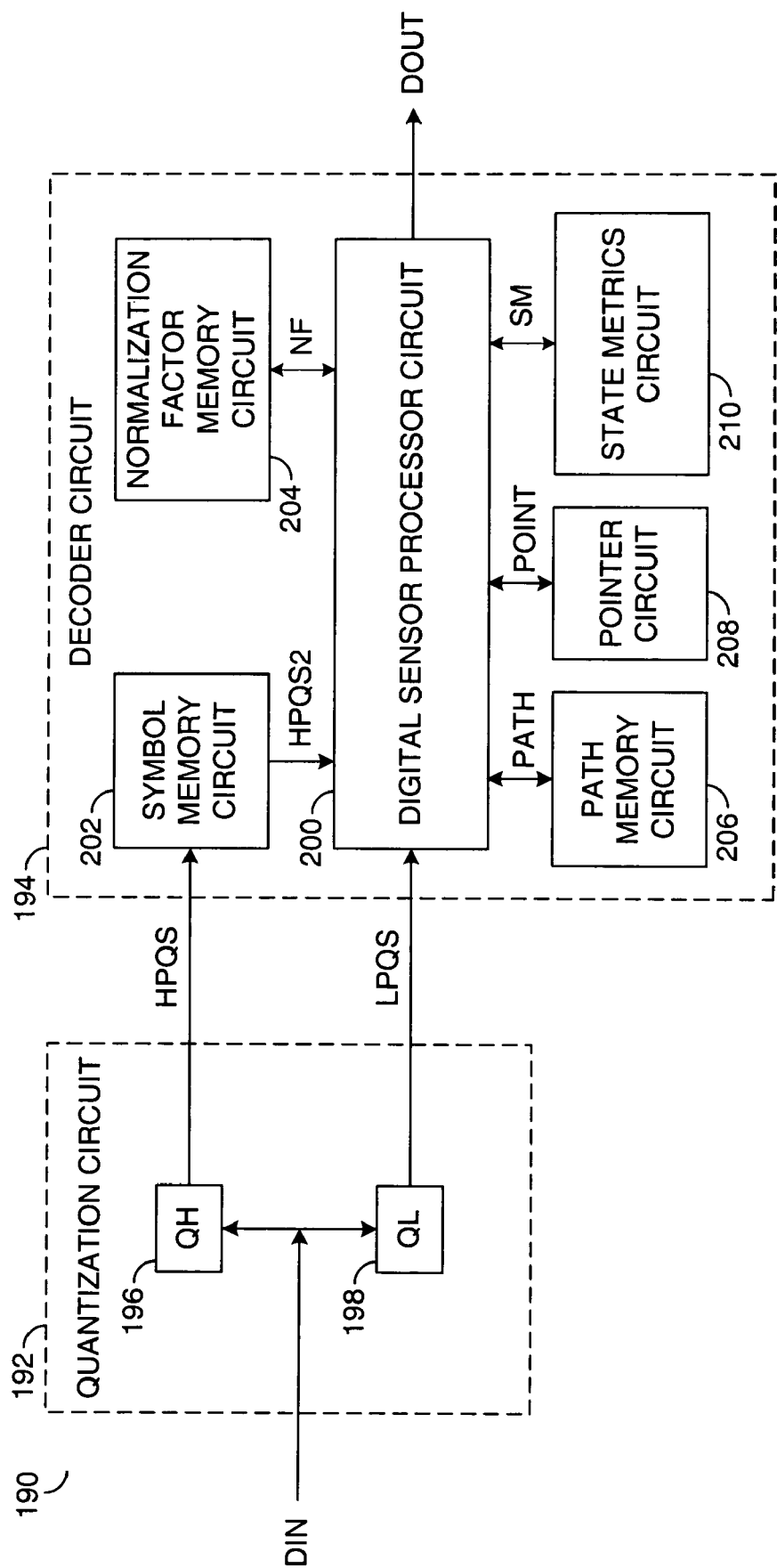
FIG. 11 is a block diagram of an example multi-resolution Viterbi decoder circuit.

Referring to FIG. 11, a block diagram of an example multi-resolution Viterbi decoder 190 circuit is shown. The circuit 190 generally comprises a quantizer circuit 192 and a decoder circuit 194. The quantizer circuit 192 generally comprises a first quantizer 196 and a second quantizer 198. The first quantizer 196 may be implemented as a hard decision quantizer or a soft decision quantizer having a low precision of only a few bits. The second quantizer 198 may be implemented as a soft decision quantizer. The second quantizer 198 may be configured to have a higher precision than the first quantizer 196.

The first quantizer 196 may be configured to quantize the symbols received in a channel signal (e.g., DIN) to produce a low precision signal (e.g., LPQS). The second quantizer 198 may be configured to quantized the symbols received in the channel signal DIN to produce a high precision signal (e.g., HPQS). Quantization of the symbols to both low and high precision may be performed simultaneously. In one embodiment, the symbols may be quantized to the high precision and then the high precision signal HPQS may be decimated or altered to generate the low precision signal LPQS. Other methods for generating the signals HPQS and LPQS may be implemented to meet the design criteria of a particular application.

The decoder circuit 194 generally comprises a signal processor 200, a memory 202, a memory 204, a memory 206, a memory 208 and a memory 210. The signal processor 200 may be implemented as a digital signal processor. The digital signal processor 200 may receive the low precision signal LPQS from the first quantizer 196. A signal (e.g., HPQS2) may be received by the digital signal processor 200 from the memory 202. A signal (e.g., NF) may be exchanged between the digital signal processor 200 and the memory 204. The digital signal processor 200 may exchange another signal (e.g., PATH) with the memory 206. A signal (e.g., POINT) may be exchanged between the digital signal processor 200 and the memory 208. A signal (e.g., SM) may be exchanged between the memory 210 and the digital signal processor 200.

The memory 202 may be implemented as a symbol memory. The symbol memory 202 may be configured to store the quantized symbols within the high precision signal HPQS. The quantized symbols may be arranged within the symbol memory 202 to correspond to respective columns of the decoder trellis. In one embodiment, the symbol memory 202 may be configured to store only the most recently high precision quantized symbols. The symbol memory 202 may present the quantized symbol(s) to the digital signal processor 200 in the signal HPQS2.

The memory 204 may be implemented as a normalization factor memory. The normalization factor memory 204 may receive multiple normalization factor values from the digital signal processor 200 within the signal NF. The normalization factor values may be arranged within the normalization factor memory 204 to correspond to respective columns of the decoder trellis. The normalization memory 204 may return a normalization factor value to the digital signal processor 200 within the signal NF. In one embodiment, the normalization factor memory 204 may be configured to store only a current normalization factor.

The memory 206 may be implemented as a path memory. The path memory 206 may be configured to store predecessor state information for each path through each state in each column of the decoder trellis. The digital signal processor 200 may provide new predecessor state information to the path memory 206 within the signal PATH. The path memory 206 may also provide predecessor state information to the digital signal processor 200 within the signal PATH.

The memory 208 may be implemented as a pointer memory. The pointer memory 208 may be configured to store multiple pointers for the decoder trellis. Each pointer may identify a predecessor state that may be two or more time steps earlier in the decoder trellis than the current state. The pointer memory 208 may exchange the pointer information with the digital signal processor 200 in the signal POINT.

The memory 210 may be implemented as a state metrics memory. The state metrics memory 210 may be configured to store state metric values for each state in each column of the decoder trellis. The state metrics memory 210 is generally designed to be capable of storing all state metrics as high precision state metrics and as low precision state metrics. The signal SM may convey new state metrics information from the digital signal processor 200 to the state metrics memory 210. The signal SM may also convey existing state metrics information from the state metrics memory 210 to the digital signal processor 200. In one embodiment, the state metrics memory 210 may only need to store the state metrics for a current state and a next state of the decoder trellis.

Several example approaches to Viterbi decoder circuits may be described as follows. Each circuit may be optimized using the metacore process described above. The example circuits may be referred to as (i) a K–1 jump fast trace-back decoder, (ii) a pipelined decoder, (iii) a semantic transformation decoder, and (iv) a massively parallel decoder.

The K–1 jump fast trace-back decoder may use a pointer structure to speed up a common computational bottleneck of the decoding process. Memory trace-back is often a slowest operation in realization of a conventional Viterbi decoder. Jump back used in conventional Viterbi decoders is commonly a single time step. In contrast, K–1 long jump pointers stored in the pointer memory circuit 208 may allow jumps of K–1 positions back within a single clock cycle. The pointers leverage on the idea that there may be only a single unique path segment that corresponds to a length K–1. The length of the K–1 jump may be defined statically or dynamically. For example, an accumulated error may be used to determine the length of the jumps.

Figure 12:
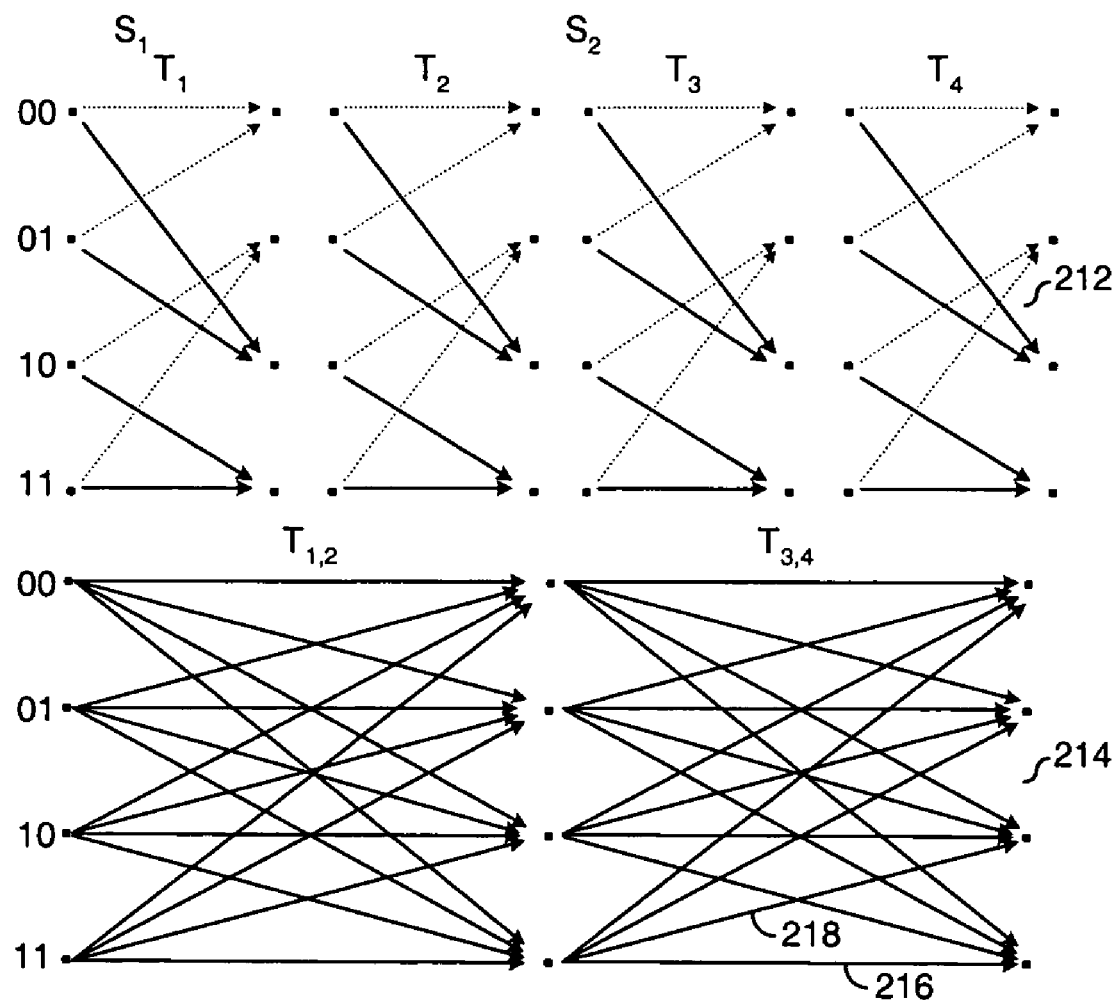
FIG. 12 is a diagram of a conventional decoder trellis compared with an example decoder trellis.

Referring to FIG. 12, a diagram of a conventional decoder trellis 212 compared with an example decoder trellis 214 having K=3 is shown. For any pair of states S1 and S2 that may be two time steps apart, there is generally only a single path starting at S1 and ending at S2. For an arbitrary value of K, any two states in the decoder trellis that are K–1 time steps apart may uniquely define a path in the trellis. The K–1 time step size may be used in updating the trellis during decoding. For each trellis state, a K–1 step predecessor state may be stored instead of a single time step previous state. Therefore, a number of steps performed in trace-back may be reduced by a factor of K–1. Each branch spanning K–1 time steps may determine a unique pattern of logical ones and logical zeros. For example, a branch 216 may represent a bit pattern of 11 while a branch 218 may represent a bit pattern of 01.

A trace-back speed increase achieved in the K–1 jump fast trace-back scheme is generally consumes additional memory. Multiple bits may be stored in each pointer since each state in the trellis may have more than two immediate previous states at each time step. In general, there may be $2^{K-1}$ states that are K–1 steps away from a given state. Thus, K–1 bits may be used at each step to store pointers for a path.

The pointers may be employed for a subset of the possible paths through the decoder trellis 214. For example, application of the pointers may be limited to a few paths having the lowest accumulated error metrics. Dynamic reallocation of the pointers to different paths may be well suited for software based implementations of the trace-back process.

A decoder trellis may be divided into multiple parallel sections to create a massively parallel decoder that may be capable of achieving very fast decoding data rates. Given a decoder trellis of a particular size (e.g., L) that may be an integer multiple of K–1, the decoder trellis may be broken into L/(K–1) equally sized sections (e.g., T1 through T$_{L/(K-1)}$), respectively. Each branch error metrics for each section Ti (when i is an integer) may be computed substantially simultaneously, independently, and in parallel with all other sections. The parallel process generally uses larger computation and storage resources than a conventional approach since all branch metrics may be computed simultaneously. However, speed gains may be realized since the computations all of the section computations may be performed in parallel.

Figure 13:
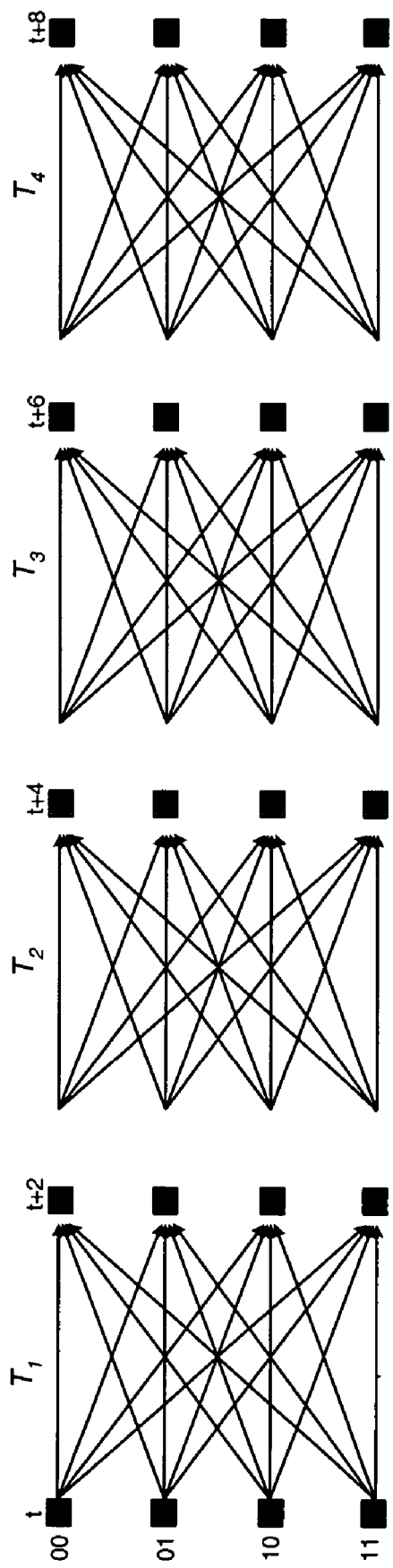
FIG. 13 is a diagram of an example parallel decoder trellis.

Referring to FIG. 13, a diagram of an example parallel decoder trellis is shown. Parameters for the example parallel decoder trellis may be K=3 and L=4*(K–1). As mentioned above, the branch error metrics associated with sections T1, T2, T3, and T4 may be computed in parallel. However, a final results for section T2 may not be computed until the computation for T1 have completed. In general, computation of the final state metrics for each state at an end of a given section Ti generally relies on knowledge of the final state or error metrics from a section Ti–1. However, since all branch metrics may already be computed for each section T, once the results from section Ti–1 become available the results for the subsequent section Ti may be computed efficiently in a second step.

The two-step parallel updating technique may be used in conjunction with the multi-resolution decoding schemes. Initial computations of all path values may be performed at low resolution thus incurring smaller overhead in terms of additional computation and storage usage. The second update step may then be performed at higher resolutions to improve the accuracy of the results.

Due to a high degree of parallelism in the trellis structure, deep-pipelining techniques may be used for the realization of parts of the Viterbi decoder. Calculations of the branch error metrics described above generally involve an addition of error metrics along each branch or segment of a path. Therefore, a pipeline may be created generally comprising one or more adders pipelined to an arbitrary level.

Figure 14:
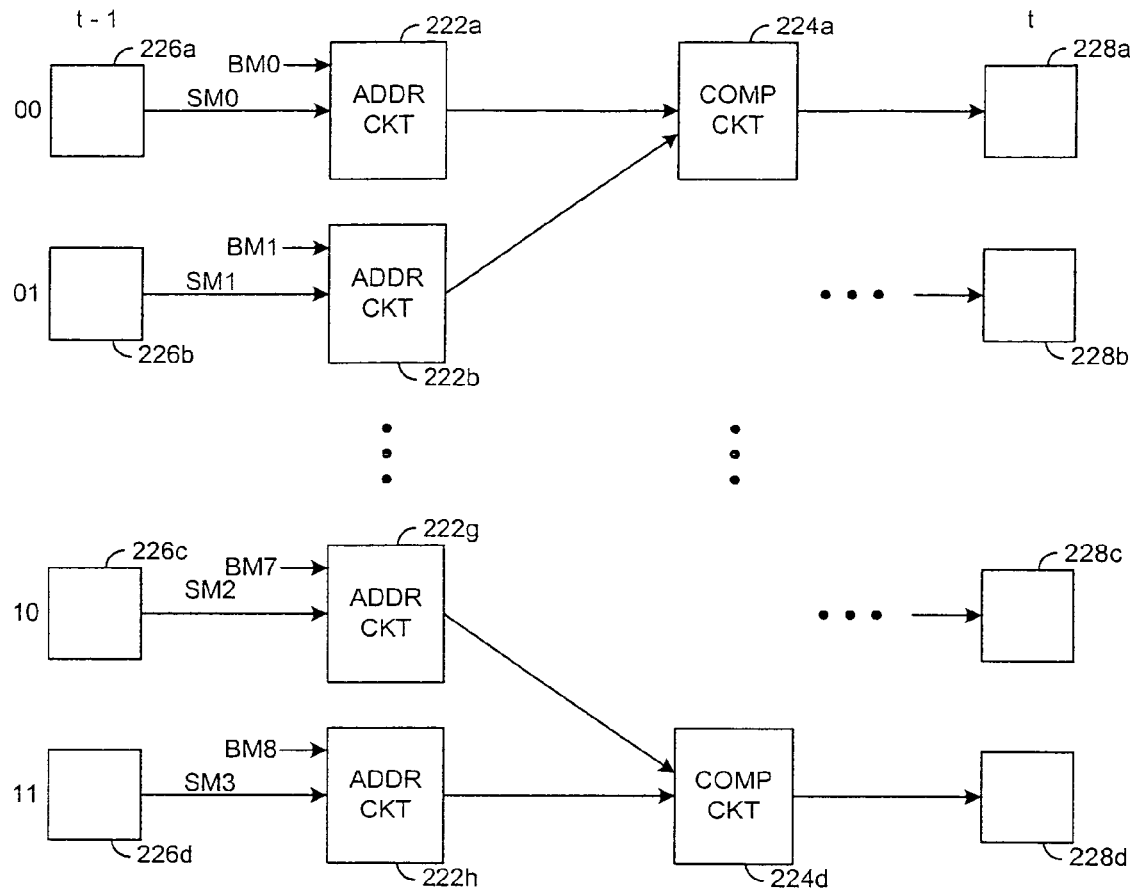
FIG. 14 is a block diagram of a portion of an adder pipeline.

Referring to FIG. 14, a block diagram of a portion of an adder pipeline 220 is shown. Multiple adders 222a-h and multiple comparator circuits 224a-d may be connected between memory cells 226a-d storing previous state metric values at a time step T–1 and memory cells 228a-d storing current state metric values at a time step T. Each adder circuit 222a-h may receive a state metric value (e.g., SM0, SM1, SM2, or SM3) from a memory cell 226a-d and a branch error metric value (e.g., BM0 through BM8) calculated elsewhere in the decoder.

Each comparator 224a-d may compare an error value generated by each branch entering a particular state memory cell 228a-d. The comparators 224a-d may route the error metric having a lowest value to the appropriate memory cell 228a-d and block the higher error metric value. Therefore, the updated state metric at each time step may be for the lowest error branch entering the state.

Each of the deep pipeline adder circuits 222a-h and the comparator circuits 224a-d may calculate an accumulated error along a particular branch between time steps. The adder circuits 222a-h and the comparator circuits 224a-d may be repeated between each pair of time steps. Since there may be no feedback loops, the circuit 220 may be pipelined to an arbitrary level thus reducing a critical path delay in calculating path metrics for each possible combination of branches.

Semantic transformations may be to speed up a computation of the error function along each possible branch of the decoder trellis. The semantic transformation approach generally leverages knowledge about a relationship between different path in a Viterbi trellis. Inherent symmetries in trellis path metric calculations may reduce the computational power computing the metrics. For any given branch or segment p in a decoder trellis, there may be a corresponding complementary branch or segment p'. A branch error (e.g., Ep) for the branch p and another branch error (e.g., Ep') for the branch p' may sum to a constant (e.g., Ec) as shown in Equation 2 as follows:

$$Ep+Ep'=Ec \qquad \text{Eq. (2)}$$

The constant Ec generally depends only on the constraint length K and may be the same for all complementary branch pairs in the trellis. Knowledge of the constant Ec may enable a reduction in the computation time since the branch metric Ep' may be determined by subtracting the branch metric Ep from the constant Ec. Computing the error metrics for half of the branches in the decoder trellis may be sufficient information to (i) calculate a plurality of first branch metrics for a first half of a plurality of path segments, (ii) calculate a plurality of second branch metrics for a second half of path segments based on, first branch metrics, and (iii) update all trellis states.

Figure 15:
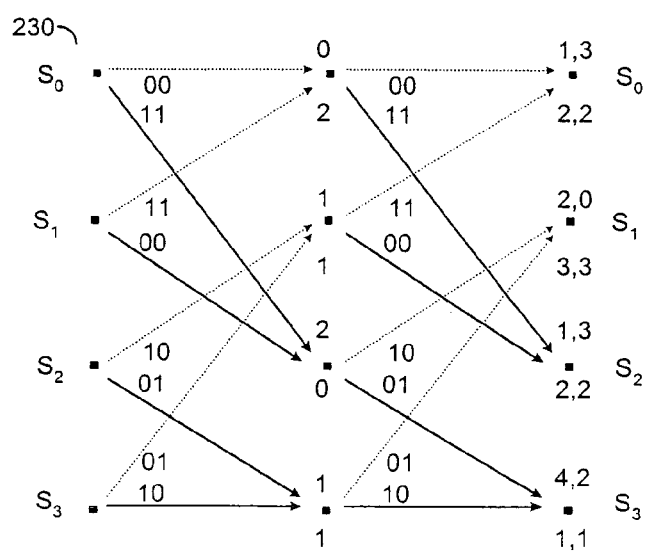
FIG. 15 is a diagram of an example decoder trellis having complementary trellis branches.

Referring to FIG. 15, a diagram of an example decoder trellis 230 having complementary trellis branches is shown. The trellis 230 may have parameters of K=3 for 2 time step jumps during trace-back. An example reception of symbols 00 and 10 is also shown. The computed errors associated with each path segment or branch may be represented by solid line state transitions. The complementary branches may be represented by dashed line state transitions. The path pairs p and p' and associated error values may be shown in Table V as follows with the constant Ec equal to four in all cases:

TABLE V

| p | p' | Ep | Ep' | Ec |
|---|----|----|-----|-----|
| S0-S0 (00 00) | S1-S3 (00 01) | 1 | 3 | 4 |
| S0-S1 (11 10) | S1-S2 (11 11) | 2 | 2 | 4 |

TABLE V-continued

| p | p' | Ep | Ep' | Ec |
|---|---|---|---|---|
| S0-S2 (00 11) | S1-S0 (11 00) | 1 | 3 | 4 |
| S0-S3 (11 01) | S1-S1 (00 10) | 4 | 0 | 4 |
| S2-S0 (10 11) | S3-S2 (00 00) | 2 | 2 | 4 |
| S2-S1 (01 00) | S3-S3 (10 10) | 3 | 1 | 4 |
| S2-S2 (10 00) | S3-S0 (01 11) | 2 | 2 | 4 |
| S2-S3 (01 10) | S3-S1 (10 01) | 1 | 3 | 4 |

In one embodiment where two paths segments may be either almost identical or almost complementary, the accumulated error on a particular path segment may be approximated or rapidly calculated using the calculated error value on the another path.

The present invention generally describes an approach for designing hardware IP and software IP that may start at a process level and leverage on intrinsic optimization degrees of freedom. Components of the approach may include, but are not limited to, problem formulation and identification of optimization degrees of freedom, objective functions and constraints, cost evaluation engine, and multi-resolution design space search.

The function performed by the flow diagrams of FIGS. 4, 7 and 8 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMS, EEPROMS, Flash memory, magnetic or optical cards, or any type of media suitable for storing electronic instructions.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. Additionally, inverters may be added to change a particular polarity of the signals. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

The invention claimed is:

1. A decoder comprising:
   a memory storing a plurality state metrics implementing a decoder trellis; and
   a processor configured to (i) calculate a plurality of first branch metrics for a first half of a plurality of path segments in said decoder trellis in response to a signal received by said decoder, (ii) calculate a plurality of second branch metrics for a second half of said path segments based upon said first branch metrics and (iii) update said state metrics in response to said first branch metrics and said second branch metrics, wherein each particular first branch metric of said first branch metrics has a complementary second branch metric of said second branch metrics such that a sum of said particular first branch metric and said complementary second branch metric equals a constant.

2. A decoder comprising:
   a memory storing a plurality state metrics implementing a decoder trellis; and
   a processor configured to (i) compute a plurality of branch metrics at each of a plurality of time steps of said decoder trellis substantially simultaneously and (ii) update said state metrics sequentially along said time steps based upon said branch metrics, wherein said processor is further configured to recomputed a subset of said branch metrics and a subset of said state metrics along a plurality of paths through said decoder trellis at a higher resolution than initially used to update said state metrics sequentially.

3. The decoder according to claim 2, further comprising:
   a plurality of pointers each configured to store one of said state metrics in said decoder trellis spanning a plurality of said time steps.

4. The decoder according to claim 2, further comprising:
   a plurality of adders each configured to add one branch metric of said branch metrics to one state metric of said state metrics at a first time step of said time steps to generate a next state metric of said state metrics at a second time step of said time steps.

5. The decoder according to claim 4, further comprising:
   a plurality of comparators each configured to (i) compare a plurality of said next state metrics and (ii) pass a lowest of said plurality of said next state metrics to said second time step.

* * * * *